United States Patent [19]

Sinclair et al.

[11] 4,200,347

[45] Apr. 29, 1980

[54] SOCKET FOR VERTICALLY MOUNTING MULTI-PIN DEVICE

[75] Inventors: William Y. Sinclair, Stockton, N.J.; Joseph Argila, Upper Black Eddy, Pa.

[73] Assignee: Aries Electronics, Inc., Frenchtown, N.J.

[21] Appl. No.: 3,629

[22] Filed: Jan. 15, 1979

[51] Int. Cl.$^2$ .............................................. H05K 1/12

[52] U.S. Cl. .......................... 339/17 CF; 339/17 LC; 339/66 M; 361/405

[58] Field of Search ........... 339/17 C, 17 CF, 17 LC, 339/17 LM, 17 D, 65, 66 M, 192 R, 210 M; 361/403, 404, 405, 408, 418

[56] References Cited

U.S. PATENT DOCUMENTS

| | | | |
|---|---|---|---|
| 3,384,864 | 5/1968 | Schwartz | 339/17 LC |
| 3,727,169 | 4/1973 | Crane et al. | 339/66 M |
| 3,905,673 | 9/1975 | Evans et al. | 339/210 M |
| 4,134,632 | 1/1979 | Lindberg et al. | 339/17 LC |

FOREIGN PATENT DOCUMENTS

| | | | |
|---|---|---|---|
| 938327 | 10/1963 | United Kingdom | 339/17 LM |

*Primary Examiner*—Neil Abrams
*Attorney, Agent, or Firm*—Anthony J. Casella

[57] ABSTRACT

A socket for vertically mounting a light emitting diode relative to a generally horizontal printed circuit board includes an elongated housing for receiving the LED, and a triangular housing connected to the elongated housing. Aligned apertures extend through the elongated housing and the triangular housing, and a corresponding plurality of terminals are disposed in the aligned channels. The receptacle portion of each terminal is disposed in the elongated housing for engaging a pin of the LED, while the post portion extends through the channel and out of a side edge of the triangular housing, whereby the axes of the terminal post portions of the terminals are at an angle to the axes of the terminal receptacle portions. Since the terminals are wholly disposed within the socket, except for the terminal post portions, the terminals may be formed of a thin, stamped electrically conductive material.

25 Claims, 9 Drawing Figures

SOCKET FOR VERTICALLY MOUNTING MULTI-PIN DEVICE

BACKGROUND OF THE INVENTION

The present invention relates to a new and improved socket for vertically or angularly mounting multi-pin electronic devices relative to a printed circuit board.

In the early application of miniaturized circuitry employing electronic devices such as dual-in-line packaged (DIP) devices and light-emitting diodes (LED), such devices were usually mounted horizontally or flush relative to the printed circuit board. At such time, component density was not considered a critical matter, and thus it was conventional to manufacture such devices so that they were adapted for horizontal mounting by placing the lead pins in rows along opposite edges of the bottom surfaces of the device. With the development of more sophisticated electronics, greater board densities and types of applications have increased and in certain instances it has been found desirable to mount electronic devices in a generally vertical disposition, or at an angled disposition relative to the printed circuit board. As an example, where LED-indicating devices are used in instrumentation circuits, it has been found desirable that in order to conserve panel area, the supporting electronics circuitry should be mounted on a board so as to extend normal to the plane of the board, and with the actual indicator devices being mounted with an indicating space lying normal to the board. It has been known that in order to use currently available LEDs, a narrow second board for carrying the LEDs is attached to the forward edge of the primary circuit board, and is mounted normal thereto. However, in order to establish good plugable interconnection between the circuit boards, the boards must be precisely connected, thereby adding to the overall cost of assembly of the device, in addition to the additional cost associated with providing the second board. Another shortcoming of this mounting arrangement is that in many cases where the primary board layout must be changed, the secondary board must be also redesigned.

In order to overcome the shortcoming of the prior art associated with a multi-circuit board arrangement, it has been known to provide a standard integrated circuit socket with two small printed circuit boards which are secured to the bottom edge of each socket, with the circuit boards being of generally triangular configuration, and maintained in spaced relationship by an insulating spacer bar. The terminal pins in the standard socket are connected, as by crimping or soldering, to the leads provided on the small, triangular printed circuit boards, and at the other end of the leads of the printed circuit board, additional pins are crimped onto the board in order to form terminal pins for connection to the primary printed circuit board. As is readily apparent, the cost associated with the manufacture of the composite standard socket and two small printed circuit boards, as well as interconnection of small pin contacts thereto is relatively expensive, and also requires precision manufacturing in order to prevent shorting of adjacent conductors. Still further, the use of printed circuit boards in conjunction with a socket results in a relatively fragile composite construction, with all of the leads provided on the printed circuit board being exposed to the elements thereby possibly leading to damage through inadvertent striking of the socket during assembly, and also contamination of the socket. Another problem associated with the prior art composite socket and printed circuit board arrangement is that during assembly, such as by soldering of the socket to the primary printed circuit board, there is always the possibility that the solder will flow on the printed circuit board thereby possibly shorting the circuit assembly.

Another form of socket for vertically mounting a multi-pin electronic device comprises the use of a standard socket in conjunction with terminal pins made of sturdy, solid posts of approximately 0.025 square inches, commonly referred to as wire wrap posts. The latter are preferably gold plated, phosphor bronze, and the leads extending from the standard socket are arranged in parallel array and disposed at an angle with respect to the bottom of the socket for achieving the vertical or angular mounting of the LED and the like relative to the printed circuit board. In order to maintain the free ends of the cantilevered terminal pins in spaced relationship, usually an apertured spacer member is provided adjacent the ends of the terminal pins. By virtue of the inherent structural strength of the leads, the resulting socket is structurally stable, however, all of the post portions of the leads extending from the socket are exposed, and thus are also subject to problems by virtue of exposure to the elements. The cost associated with the manufacture of a socket having solid wire wrap posts is relatively expensive, especially in view of the length of the terminal post portions.

SUMMARY OF THE PRESENT INVENTION

Accordingly, it is an object of the subject invention to provide a new and improved socket for vertically mounting a multi-pin electronic device, and more particularly, a socket in which the entire length of each lead is encased, thereby minimizing potential damage or contamination by exposure to the elements.

It is a further object to provide a socket which provides a very rigid structure for facilitating assembly and disassembly of the socket in the printed circuit board.

Still another object of the invention is to provide a socket which is of cheaper construction, and which may be readily manufactured, and which employs leads that are of inexpensive construction as compared to the prior art device which employ solid, wire wrap leads.

Another object of the invention is to provide a socket which has inherent means to prevent shorting during the soldering of the socket to a printed circuit board.

The above and other objects and advantages are achieved by a socket including an elongated housing having a plurality of parallel channels extending therethrough, which elongated housing is connected to a generally triangular housing having first, second, and third side edges. The first side edge of the triangular housing is preferably releasably connected to the bottom surface of the elongated housing, and a corresponding plurality of parallel channels extend through the triangular housing from the first side edge to the third side edge. The first and third side edges are disposed at an angle relative to one another, usually on the order of 60° or 90°, and a corresponding plurality of terminals is provided in the aligned channels. Each terminal includes a receptacle portion that is disposed adjacent the upper surface of the elongated housing, with the post portion of each terminal extending through the aligned channels and being cantilevered from the third surface of the triangular housing. By this construction, the axes of the terminal post portions are at an angle to the axes of the terminal receptacle portions, corresponding to the angle between the first and second side edges of the triangular housing. Each terminal is preferably formed of a thin, stamped, electrically conductive material, and in the assembled condition of the socket, substantially the entire length of each terminal pin is wholly encased within the socket, thereby minimizing damage by exposure to the elements or inadvertent striking during assembly.

Preferably the triangular housing is formed of a triangular-shaped center body and two opposed, triangular-shaped covers, with the channels being defined by elongated, parallel grooves cut into either the center body or in each cover. The center body and the covers are preferably held together by a snap-fit connection, and the plan areas of the covers are preferably larger than the plan area of the center body. Accordingly, when mounted on a printed circuit board, the covers contact the board, while the center body is spaced therefrom. The standoff of the center body aids in cleaning the interconnection of the terminal posts to the circuit board.

DESCRIPTION OF THE DRAWINGS

Referring to FIG. 1, sockets made according to the subject invention are generally designated by the numeral 10 and are mounted for electrical connection to the leads 12 of a printed circuit board 14. In turn, each socket 10 mounts a multi-pin electronic device 16, such as a light-emitting diode (LED) or a liquid crystal display. The read-out face of the LED 16 is disposed at an angle which is generally orthogonal to the plane of the printed circuit board 14, with the plurality of LEDs 16 being mounted by sockets 10 and maintained in spaced relationship by means of a spacer bar 18. The latter is secured to the sockets 10 by a snap-on fitting comprising protrusions 20 forming a portion of each socket 10, and cooperating apertures provided in the spacer bar 18. As illustrated in FIG. 1, by virtue of the sockets 10, the indicating devices 16 are mounted at an angle to the plane of the printed circuit board, thereby facilitating their use in instrumentation circuits, and also conserving space on the printed circuit board.

Each socket 10 basically comprises a housing which may be formed of a unitary, molded member of plastic material such as glass filled nylon, and a plurality of electrically conductive terminals 22 extending therethrough. In one embodiment of the socket 10, as illustrated in FIGS. 2 through 7, the housing may be formed of several members which are connected together. More particularly, as shown in FIG. 2, the housing may be formed of an elongated, rectangular housing portion 30 having a plurality of channels 32 therein (see FIG. 7) for accommodating the receptacle portions 24 of the terminal pins 22. The elongated, rectangular housing 30 may be constructed of a two-piece socket assembly, as described and illustrated in U.S. Pat. No. 3,732,529 which issued to Lawrence P. Weisenburger on May 8, 1973, and which is assigned to the common assignee of the subject application. The remaining portion of the housing includes a generally triangular housing 34 formed by a generally triangular center body portion 36 and two opposed, triangular-shaped cover portions 38, 38. As shown in FIGS. 2, 3, and 4, the generally triangular center body portion 34 includes a first pair of projections 40 which are adapted to engage cooperating apertures 31 in the generally elongated housing 30 for connecting the center body portion 36 to the lower or bottom surface of the rectangular housing portion 30. Along the longer side or hypotenuse of the generally triangular housing 34, the two protrusions 22 are provided for engaging the cooperating apertures in the spacer bar 18. Provided in the opposed side walls 42 of the center body portion 36 are two pairs of apertures 44 which receive pins extending from the triangular cover portions, 38, 38 in order to secure the triangular cover portions to the center body portion, as more fully described hereinafter. FIGS. 5 and 6 illustrate a triangular cover portion 38 as including projections 46 for engaging the holes 44 in the center body portion 36, as well as a plurality of generally parallel elongated channels or slots 50 disposed therein and extending generally parallel to the hypotenuse of the cover body portion. The ends of the channels 50 which are disposed adjacent the projections 40 of the center body 34 which is mounted on the bottom of the rectangular housing portion 30 have enlarged bell-mouth or tapered openings 52 for facilitating the assembly of the socket 10, as more fully described hereinafter. By virtue of the construction of the center body portion 36 and the cover portions 38, 38, when the generally triangular housing portion 34 is assembled, the cooperation of the smooth or planar side walls 42 and the grooved interior surface of each cover portion 38 results in a triangular housing having a plurality of parallel channels extending therethrough, in a direction generally parallel to the hypotenuse of the triangular housing. The parallel channels in the triangular housing are effective during manufacture of the socket 10, for guiding and enclosing the elongated terminal posts 26 of the terminal pins 22. In the final assembled condition of the socket 10 the channels maintain the terminal posts 26 in spaced, electrically-isolated disposition. During assembly, the enlarged tapered openings 52 facilitate the guiding of the elongated posts 26 from their initial condition (as shown in FIG. 2) as the rectangular socket portion 30 is secured to the triangular housing 35. As shown in FIG. 7, during the intermediate step in the assembly of the socket 10, the terminal pins are maintained in spaced, parallel relationship, and are directed through the channels 50 of the triangular housing 34. It is noted that the terminals 22 are preferably made of six mil, electrically conductive material, such as phosphor bronze. This is in sharp contrast to the prior art sockets for vertically mounting a multi-pin electronic device wherein the terminal pins are made of sturdy, solid posts of approximately 0.025 square inches, which are usually referred to as wire wrap posts. The posts 26 may be made of much thinner, cheaper material, and by virtue of the fact that the channels 50 provide a total enclosure for each terminal, electrical isolation of adjacent terminals is achieved. In addition, the channeled housing provides structural support to the terminal posts when the socket 10 is fully assembled. During the final stages of assembly, the generally rectangular housing 30 is forced against the end wall of the generally triangular housing 34 such that the projections 40 are snap-fit into apertures 31 in the bottom of the rectangular housing 30, and at such time the free ends of the terminal posts 26 extend through and beyond the parallel channels 50 in the triangular housing 34. Next, the portions of the terminal posts extending beyond the triangular housing are straightened, by using a conventional pin straightening machine, and in addition are cut off to a uniform length.

FIG. 8 illustrates the mounting of a socket 10 of the subject invention to the printed circuit board 14, and it is noted that the ends of the terminal posts 26 extend through apertures 15 in the printed circuit board 14 and are connected, such as by soldering, to the leads 12 of the printed circuit board.

Although the terminal posts 26 are illustrated in FIGS. 2 and 7 as being of variable lengths, in relation to the lengths of the parallel channels 50 in the triangular housing 34, it is readily apparent that prior to initial assembly, all of the terminal posts may be of the same length, and after assembly of the rectangular housing 30 to the triangular housing 34, the terminal posts extending from the triangular housing may be straightened, and cut to a uniform length. As illustrated in FIG. 7, the receptacle portion 24 of each terminal 22 is disposed within the generally rectangular housing. It is noted that the longitudinal axes of the receptacle portions 24 of the terminals 22 are disposed at an angle to the longitudinal axes of the ends of the posts 26 which are connected to the printed circuit board. Accordingly, the socket 10 is capable of angularly mounting an LED or the like relative to the plane of a printed circuit board.

Referring to FIG. 8, it is noted that the plan area of each cover panel 38 is greater than the plan area of the side 42 of the generally triangular center body 36 such that the center body is spaced from the surface of the printed circuit board 14. The spacing is designated by the letter "S", and is provided to facilitate cleaning of flux and residue from the printed circuit board, following the soldering operation or other bonding operation of the terminal posts 26 to the leads 12 of the printed circuit board 14.

Figure 1:
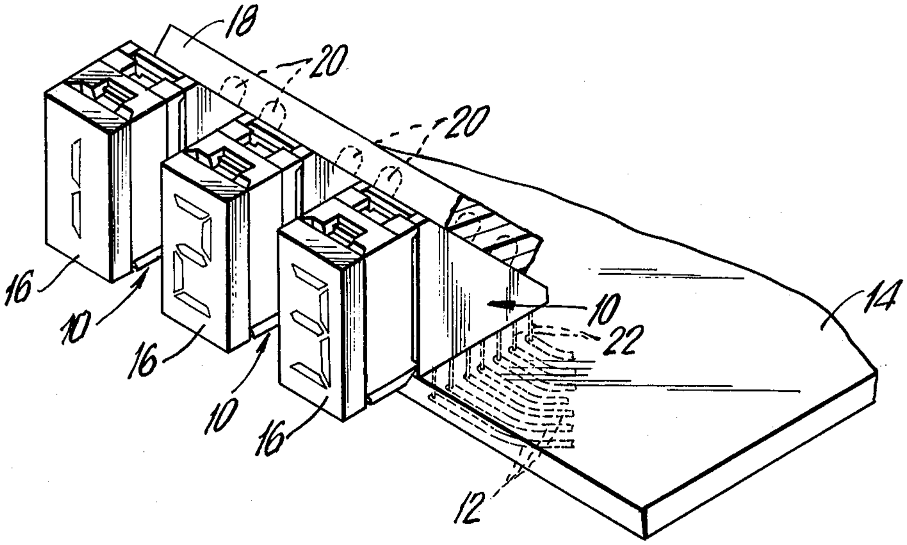
FIG. 1 is a perspective view of a plurality of sockets made according to the subject invention and mounted on a printed circuit board.
Figure 2:
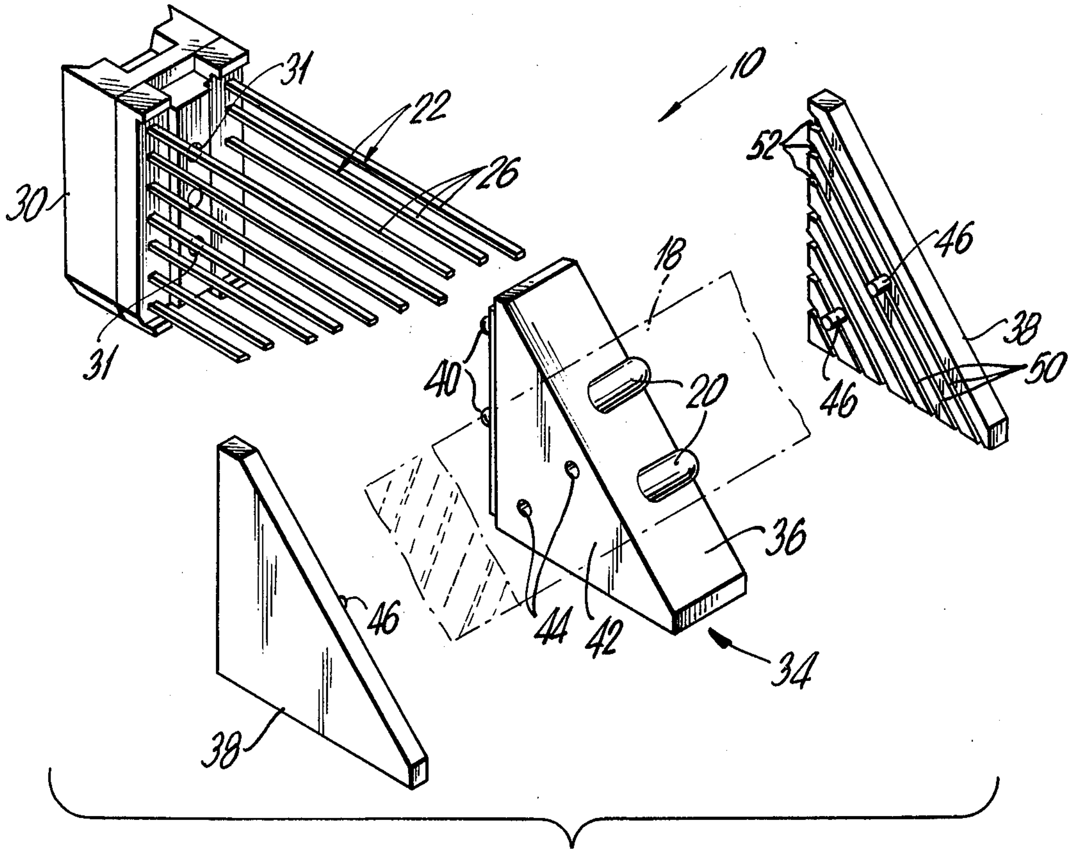
FIG. 2 is an exploded perspective view of a socket made according to the subject invention.
Figure 4:
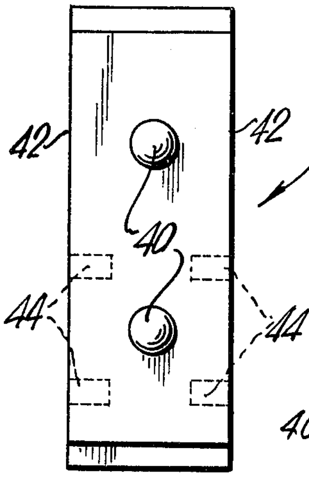
FIG. 4 is an end elevational view of the center portion of the generally triangular housing as illustrated in FIG. 3.
Figure 3A:
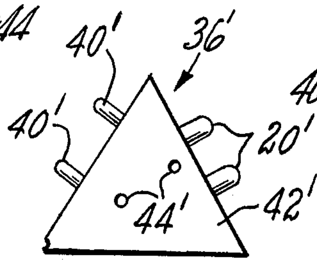
FIG. 3A is a side elevational view of the center portion of a generally triangular housing according to an alternate embodiment of the subject socket.
Figure 3:
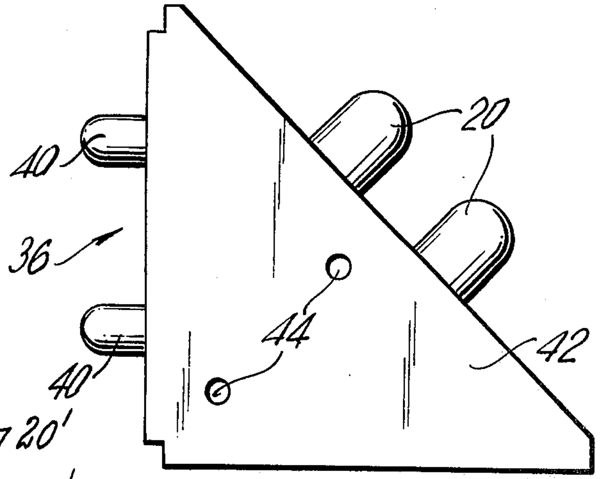
FIG. 3 is a side elevational view of the center portion of the generally triangular housing of the subject socket.
Figure 6:
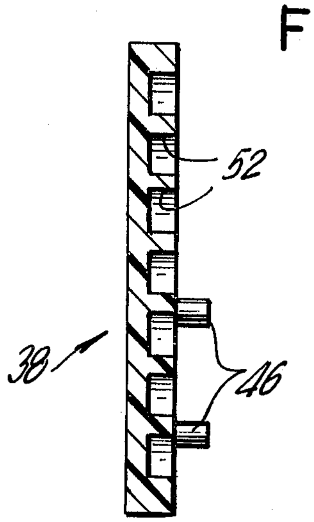
FIG. 6 is a cross-sectional view taken along line 6—6 in FIG. 5.
Figure 5:
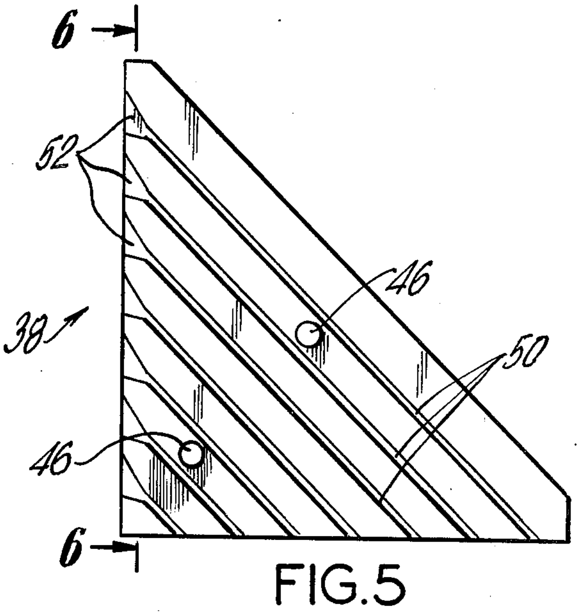
FIG. 5 is a side elevational view of a cover portion of the generally triangular housing of the subject socket.
Figure 7:
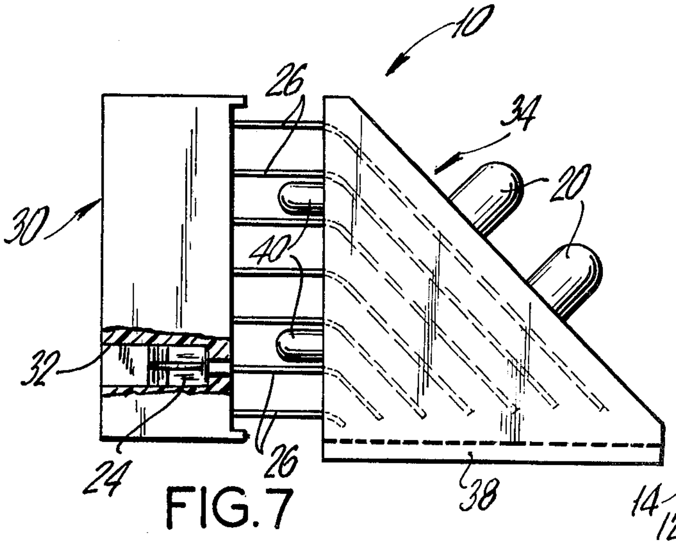
FIG. 7 illustrates an intermediate step in the assembly of the socket of the subject invention.
Figure 8:
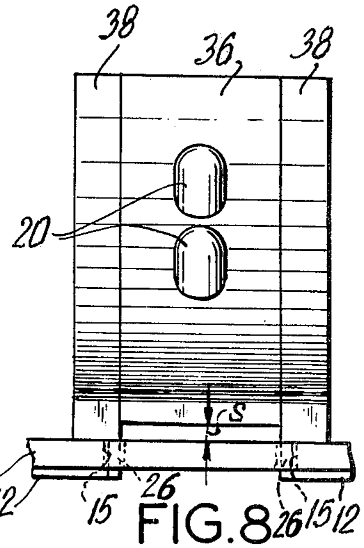
FIG. 8 is an end elevational view of a socket of the subject invention as mounted on a printed circuit board.

Although the invention has been described with respect to a preferred embodiment, it is readily apparent that various modifications and changes may be made without departing from the spirit and scope of the invention. More particularly, the channels 50 formed in the triangular housing may be defined by elongated channels formed or molded into the center body portion 36, and which cooperate with planar inner surfaces of the cover portions 38, 38. In addition, as indicated above, the entire housing portion of the socket 10 may be formed of a single molded structure, rather than resorting to a plurality of individual pieces, as shown in the preferred embodiment. Still further, although the center body 34 is illustrated as being formed of a right triangle, the configuration thereof may be of any configuration, such as an equilateral triangle (see FIG. 3A, with the elements of the socket 36' corresponding to the socket 36 shown in FIG. 3A, but designated by prime numerals), or any other configuration, when it is desired to mount a multi-pin electronic device at a specific angle relative to the plane of the printed circuit board.

Accordingly, there is provided a new and improved socket for angularly mounting a multi-pin electronic device relative to a printed circuit board. The socket of the subject invention is specifically constructed such that the terminal posts are wholly encased within the socket, except for the extended portions thereof which are to be connected to the printed circuit board leads, and thus the encased terminal posts are not exposed to the elements. Still further, by virtue of the channeled construction within the housing of the subject socket, whereby the posts are not exposed, a sturdy, rigid socket is provided which enables the socket to be readily handled for manual insertion and removal of the LED devices, and for mounting the socket to a printed circuit board. In addition, by virtue of the terminal posts being encased within the housing, the terminal posts may be made of thinner, cheaper material, as contrasted to the prior art which require the use of expensive wire wrap posts. Another benefit achieved by virtue of the encasement of the terminal posts within the housing of the subject socket is that the posts are not exposed to the heat of the soldering operation during assembly of the socket to a printed circuit board. The specific construction of the center body 34, and in particular the arrangement wherein the cover portions 38, 38 are larger in plan than the side walls 42 of the center body 36, affords a space "S" below a major portion of the socket to facilitate cleaning following assembly of the socket 10 to a printed circuit board.

Accordingly, it is intended that the illustrative and descriptive materials herein be used to illustrate the principles of the invention and not to limit the scope thereof.

We claim:

1. A socket for vertically mounting multi-pin electronic devices comprising:

an elongated housing having a plurality of parallel channels extending therethrough;

a generally triangular housing having first, second, and third side edges, said triangular housing having a corresponding plurality of parallel channels extending therethrough from said first side edge to said second side edge, said triangular housing being connected to said elongated housing along said first side edge such that the plurality of channels in the elongated housing are aligned with the corresponding plurality of channels in the triangular housing, said triangular housing including a generally triangular center body portion connected to two opposed, triangular-shaped cover portions, each cover portion including parallel slots on the inside surface thereof to define with the center body portion the plurality of parallel channels in the triangular housing; and a corresponding plurality of terminals, each of which is disposed in an aligned channel, each terminal including (1) a post portion extending from said second side edge of the triangular housing, and (2) a receptacle portion received within a respective one of said channels in the elongated housing for engaging a pin of said multi-pin electronic device, whereby the axes of the terminal posts portions are at an angle to the axes of the terminal receptacle portions.

2. A socket for vertically mounting multi-pin electronic devices as in claim 1 wherein said first and second side edges of the generally triangular housing are disposed 60° relative to one another.

3. A socket for vertically mounting multi-pin electronic devices as in claim 1 wherein said first and second side edges of the generally triangular housing are disposed orthagonal to one another.

4. A socket for vertically mounting multi-pin electronic devices as in claim 1 wherein said triangular housing includes projections extending from said first side edge, and wherein the surface of the elongated housing contiguous to said first side edge of the triangular housing includes apertures for receiving said projections for connecting said triangular housing to the elongated housing.

5. A socket for vertically mounting multi-pin electronic devices as in claim 1 wherein each channel in the generally triangular housing includes an enlarged tapered opening adjacent the first side edge of the triangular housing.

6. A socket for vertically mounting multi-pin electronic devices as in claim 1 wherein protrusions are provided on the third side edge of said generally triangular housing, said protrusions adapted to engage a spacer bar for maintaining said socket in spaced relationship to adjacent sockets.

7. A socket for vertically mounting multi-pin electronic devices as in claim 1, wherein said center body portion is connected to the opposed cover portions by a snap fit connection.

8. A socket as in claim 1 wherein each said terminal is formed by stamping of a six mil, electrically conductive material.

9. A socket as in claim 8 wherein said electrically conductive material is phosphor bronze.

10. A socket as in claim 1, wherein said triangular housing further includes protrusions adapted to engage a spacer bar for maintaining said socket in fixed relationship relative to adjacent sockets.

11. A socket as in claim 1 wherein said triangular housing is molded of plastic material.

12. A socket as in claim 11 wherein said triangular housing is molded of a glass filled nylon.

13. A socket for vertically mounting multi-pin electronic devices comprising:

an elongated housing having a plurality of parallel channels extending therethrough;

a generally triangular housing having first, second, and third side edges, said triangular housing having a corresponding plurality of parallel channels extending therethrough from said first side edge to said second side edge, said triangular housing being connected to said elongated housing along said first side edge such that the plurality of channels in the elongated housing are aligned with the corresponding plurality of channels in the triangular housing, and said triangular housing including a generally triangular center body portion connected to two opposed, triangular-shaped cover portions, with the opposite sides of said center body portion having parallel grooves extending therein to define with the cover portions the plurality of parallel channels in the triangular housing; and a corresponding plurality of terminals, each of which is disposed in an aligned channel, each terminal including (1) a post portion extending from said second side edge of the triangular housing, and (2) a receptacle portion received within a respective one of said channels in the elongated housing for engaging a pin of said multi-pin electronic device, whereby the axes of the terminal posts portions are at an angle to the axes of the terminal receptacle portions.

14. A soecket for vertically mounting multi-pin electronic devices as in claims 1 or 13 wherein each of the opposed triangular-shaped cover portions is of greater plan area than the center body portion whereby, when the socket is mounted on a printed circuit board, the center body portion is spaced from the circuit board.

15. A socket for vertically mounting multi-pin electronic devices as in claim 13 wherein said first and second side edges of the generally triangular housing are disposed 60° relative to one another.

16. A socket for vertically mounting multi-pin electronic devices as in claim 13 wherein said first and second side edges of the generally triangular housing are disposed orthagonal to one another.

17. A socket for vertically mounting multi-pin electronic devices as in claim 13 wherein said triangular housing includes projections extending from said first side edge, and wherein the surface of the elongated housing contiguous to said first side edge of the triangular housing includes apertures for receiving said projections for connecting said triangular housing to the elongated housing.

18. A socket for vertically mounting multi-pin electronic devices as in claim 13 wherein each channel in the generally triangular housing includes an enlarged tapered opening adjacent the first side edge of the triangular housing.

19. A socket for vertically mounting multi-pin electronic devices as in claim 13 wherein protrusions are provided on the third side edge of said generally triangular housing, said protrusions adapted to engage a spacer bar for maintaining said socket in spaced relationship to adjacent sockets.

20. A socket for vertically mounting multi-pin electronic deivces as in claim 13 wherein said center body portion is connected to the opposed cover portions by a snap fit connection.

21. A socket as in claim 13 wherein each said terminal is formed by stamping of a six mil, electrically conductive material.

22. A socket as in claim 21 wherein said electrically conductive material is phosphor bronze.

23. A socket as in claim 13, wherein said triangular housing further includes protrusions adapted to engage a spacer bar for maintaining said socket in fixed relationship relative to adjacent sockets.

24. A socket for receiving an electronic multi-pin package as in claim 13, wherein said housing is molded of plastic material.

25. A socket as in claim 24 wherein said triangular housing is molded of a glass filled nylon.

* * * * *